United States Patent
Jantke et al.

(10) Patent No.: US 11,578,212 B2
(45) Date of Patent: Feb. 14, 2023

(54) THERMAL TREATMENT OF SILICON PARTICLES

(71) Applicant: WACKER CHEMIE AG, Munich (DE)

(72) Inventors: Dominik Jantke, Burghausen (DE); Robert Maurer, Munich (DE)

(73) Assignee: Wacker Chemie AG, Munich (DE)

( * ) Notice: Subject to any disclaimer, the term of this patent is extended or adjusted under 35 U.S.C. 154(b) by 108 days.

(21) Appl. No.: 16/758,184

(22) PCT Filed: Jul. 25, 2018

(86) PCT No.: PCT/EP2018/070234
§ 371 (c)(1),
(2) Date: Apr. 22, 2020

(87) PCT Pub. No.: WO2020/020458
PCT Pub. Date: Jan. 30, 2020

(65) Prior Publication Data
US 2021/0371665 A1    Dec. 2, 2021

(51) Int. Cl.
*C01B 33/02* (2006.01)
*C09C 1/28* (2006.01)
(Continued)

(52) U.S. Cl.
CPC .............. *C09C 1/28* (2013.01); *C01B 33/02* (2013.01); *C09C 3/006* (2013.01); *C09C 3/041* (2013.01); *C09C 3/063* (2013.01); *C09D 11/037* (2013.01); *C09D 11/52* (2013.01); *H01M 4/366* (2013.01); *H01M 4/386* (2013.01); *C01P 2002/80* (2013.01); *C01P 2004/80* (2013.01); *H01M 2004/027* (2013.01)

(58) Field of Classification Search
CPC ........... H01M 4/622; C09C 1/28; C30B 29/06
See application file for complete search history.

(56) References Cited

U.S. PATENT DOCUMENTS

| | | | |
|---|---|---|---|
| 2003/0059361 A1* | 3/2003 | Carberry | C01B 33/02 423/348 |
| 2013/0136986 A1 | 5/2013 | Scoyer et al. | |

(Continued)

FOREIGN PATENT DOCUMENTS

| | | |
|---|---|---|
| DE | 102015215415 A1 | 2/2017 |
| EP | 1102340 B1 | 5/2001 |

(Continued)

OTHER PUBLICATIONS

Shepherd M. Tichapondwa et al., "Suppressing Hydrogen Evolution by Aqueous Silicon Powder Dispersions by Controlled Silicon Surface Oxidation," Propellants, Explosives, Pyrotechnics, 2013, vol. 38, pp. 48-55.

(Continued)

*Primary Examiner* — Khanh T Nguyen
(74) *Attorney, Agent, or Firm* — Brooks Kushman P.C.

(57) ABSTRACT

Silicon particles with a reduced and/or delayed propensity to generate hydrogen gas by reaction with water in aqueous inks for preparing lithium ion battery anodes are prepared by milling silicon, preferably in an oxidative atmosphere, followed by heat treating at an elevated temperature in vacuum or an inert atmosphere.

7 Claims, 1 Drawing Sheet

(51) Int. Cl.
*C09C 3/00* (2006.01)
*C09C 3/04* (2006.01)
*C09C 3/06* (2006.01)
*C09D 11/037* (2014.01)
*C09D 11/52* (2014.01)
*H01M 4/36* (2006.01)
*H01M 4/38* (2006.01)
*H01M 4/02* (2006.01)

(56) References Cited

U.S. PATENT DOCUMENTS

| | | | |
|---|---|---|---|
| 2018/0212234 A1* | 7/2018 | Haufe | H01M 4/622 |
| 2019/0247859 A1 | 8/2019 | Hanelt et al. | |
| 2019/0305366 A1 | 10/2019 | Wegener et al. | |

FOREIGN PATENT DOCUMENTS

| | | |
|---|---|---|
| EP | 1313158 A2 | 5/2003 |
| JP | 4396858 B2 | 1/2010 |
| KR | 20130040198 A | 4/2013 |
| KR | 20150034563 A | 4/2015 |
| WO | 2017025346 A1 | 2/2017 |
| WO | 18082880 A1 | 5/2018 |
| WO | 2018077389 A1 | 5/2018 |
| WO | 2018082789 A1 | 5/2018 |
| WO | 2018082794 A1 | 5/2018 |

OTHER PUBLICATIONS

Amina Touidjine et al., "Partially Oxidized Silicon Particles for Stable Aqueous Slurries and Practical Large-Scale Making of Si-Based Electrodes," Journal of the Electrochemical Society, 2015, vol. 162, Issue 8, pp. A1466-A1475.

* cited by examiner

THERMAL TREATMENT OF SILICON PARTICLES

CROSS REFERENCE TO RELATED APPLICATIONS

This application is the U.S. National Phase of PCT Appln. No. PCT/EP2018/070234 filed Jul. 25, 2018, the disclosure of which is incorporated in its entirety by reference herein.

BACKGROUND OF THE INVENTION

1. Field of the Invention

The invention relates to a process for the thermal treatment of silicon particles, silicon particles which are obtainable in this way and also the use thereof for producing aqueous ink formulations and anodes for lithium ion batteries.

2. Description of the Related Art

Rechargeable lithium ion batteries are at present the most practical electrochemical energy stores having the highest gravimetric energy densities. Silicon has a particularly high theoretical material capacity (4200 mAh/g) and is therefore particularly suitable as an active material for anodes of lithium ion batteries. Anodes are produced by means of anode inks in which the individual constituents of the anode material are dispersed in a solvent. On an industrial scale, water is usually employed as a solvent for the anode inks for economic and ecological reasons. Silicon is very reactive toward water and on contact with water is oxidized to form silicon oxides and hydrogen. Liberation of hydrogen leads to considerable difficulties in the processing of the anode inks. For example, such inks can give inhomogeneous electrode coatings because of included gas bubbles. In addition, the formation of hydrogen makes complicated safety measures necessary. Undesirable oxidation of silicon in the anode ink finally also leads to a decrease in the proportion of silicon in the anode, which reduces the capacity of the lithium ion battery.

Lithium ion batteries having anode materials containing silicon particles are known, for example, from DE102015215415. DE102015215415 describes silicon particles having a volume-weighted particle size distribution of $d_{10} \geq 0.2$ μm and $d_{90} \leq 20.0$ μm and a width $d_{90}-d_{10}$ of ≤15 μm for this purpose. EP1313158, on the other hand, recommends silicon particles which have average particle sizes of from 100 to 500 nm and have been produced by milling and subsequent oxidative treatment with oxygen-containing gases at from 80 to 450° C. or in inert gases having a relatively low oxygen content at from 80 to 900° C. for such purposes. According to EP1313158, larger particle sizes are disadvantageous for the Coulombic efficiency of corresponding batteries.

In order to reduce gas evolution in the aqueous processing of silicon particles and the problems associated therewith during processing, it has frequently been recommended that the surface of silicon particles be oxidized, for example as described in KR1020150034563. WO 2018/077389 recommends carrying out the oxidative treatment of silicon particles with an oxygen-containing gas at from 80 to 900° C. in order to make the particles more resistant to aqueous media. EP1102340 teaches producing silicon particles for lithium ion batteries by milling in lean air.

Touidjine, Journal of The Electrochemical Society, 2015, 162, pages A1466 to A1475, is concerned with reducing hydrogen formation on contact of milled silicon particles with water. For this purpose Touidjine teaches partially oxidizing the silicon particles by means of water or in air at elevated temperature. The silicon particles used for the oxidation have an $SiO_2$ content of 9% by weight and after oxidation of air have an $SiO_2$ content of 11% by weight, in each case based on the total weight of the silicon particles. The silicon particles have average particle sizes of 150 nm and are present in the form of aggregates. The silicon particles used for the oxidation have a specific BET surface area of 14 $m^2/g$, which is reduced in the course of the oxidation with air as proposed by Touidjine. Touidjine recommends the use of such partially oxidized silicon particles for the production of aqueous anode inks for anodes of lithium ion batteries.

Tichapondwa, Propellants, Explosives, Pyrotechnics, 2013, 38, pages 48 to 55, discusses aqueous silicon dispersions as precursors for retarded pyrotechnic igniters. To suppress hydrogen formation on contact of the silicon particles with water, Tichapondwa recommends providing the surface of the silicon particles with a protective silicon oxide layer by oxidation at elevated temperature in air. The silicon particles which have been subjected to the oxidation have an average particle diameter of 2.06 μm, a BET surface area of 9.68 $m^2/g$ and have been oxidized to an extent of 13%, based on silicon, and are present in aggregated form. The oxidized silicon particles of Tichapondwa are also aggregated, as was shown by laser light scattering with and without treatment with ultrasound. However, it can be seen from FIG. 1 of the article by Tichapondwa that these oxidized, aggregated silicon particles still liberate considerable amounts of hydrogen in water, despite the very high proportions of oxide.

When silicon particles are used in lithium ion batteries, the oxidative treatment of the particles generally leads to a reduction in the capacity and can also bring about an initial consumption of lithium or insulation of the silicon particles. In addition, process-engineering problems such as uncontrolled overoxidation or dust explosions, which make particular safety measures necessary, can occur in the oxidation of silicon particles with oxygen.

Any native oxide layers as are formed, for instance, during milling or storage of silicon particles, may not passivate silicon particles sufficiently for the formation of hydrogen to be suppressed during processing of the silicon particles in aqueous media, in particular in anode inks for lithium ion batteries. Milling processes for producing silicon particles are described, for example, in WO2018/082789 and WO2018/082794.

In the light of this background, there continues to be a need for providing measures by means of which the problems occurring in the processing of silicon particles in aqueous media are solved, in particular in the processing of materials to form electrodes, and at the same time a reduction in the capacity or a buildup of a thick, insulating layer can be prevented. This process should, in particular, be able to be carried out safely and in a controlled manner.

SUMMARY OF THE INVENTION

The invention provides processes for producing silicon particles which have volume-weighted particle size distributions having diameter percentiles $d_{50}$ of from 1.0 μm to 10.0 μm and an oxygen content of from 0.1 to 5% by weight, based on the total weight of the silicon particles, wherein 1) silicon is milled to form silicon particles, with the milling being carried out in an oxidative atmosphere or in an oxidative medium and/or the silicon particles obtained by means of milling being exposed to an oxidative atmosphere, and
2) the silicon particles obtained in step 1) are thermally treated at a temperature of from 300° C. to 1100° C. in an inert gas atmosphere or under reduced pressure.

DETAILED DESCRIPTION OF THE PREFERRED EMBODIMENTS

Figure 1:
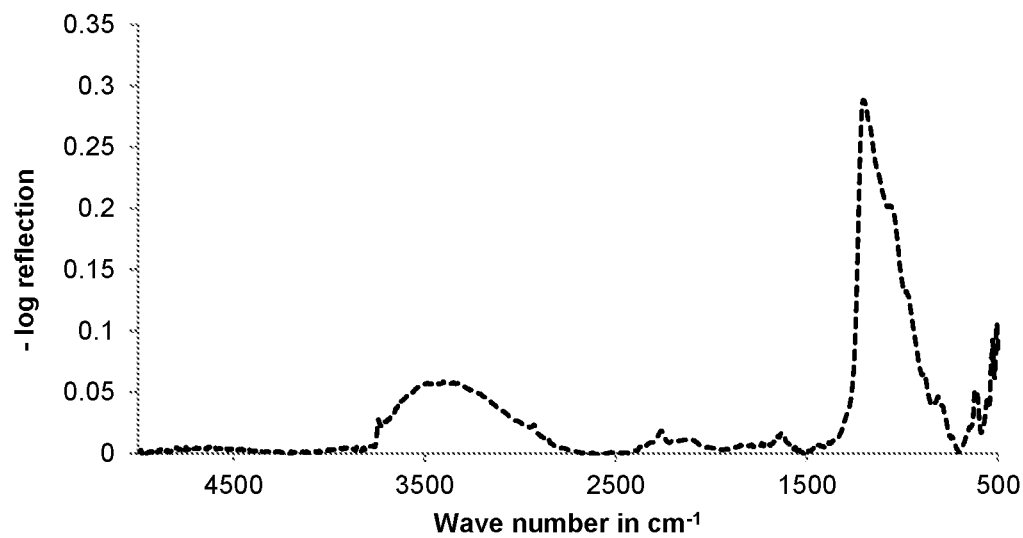
FIG. 1 is a DRIFT spectrum of a silicon powder not prepared in accordance with the invention.

The invention further provides silicon particles which have volume-weighted particle size distributions having diameter percentiles $d_{50}$ of from 1.0 μm to 10.0 μm and an oxygen content of from 0.1 to 5% by weight, based on the total weight of the silicon particles, obtainable by the process of the invention.

The invention further provides silicon particles which have volume-weighted particle size distributions having diameter percentiles $d_{50}$ of from 1.0 μm to 10.0 μm and an oxygen content of from 0.1 to 5% by weight, based on the total weight of the silicon particles, characterized in that the ratio of the maximum of the negative logarithmic reflection signal of SiOH, in particular in the range from 3300 cm$^{-1}$ to 3500 cm$^{-1}$, to the maximum of the negative logarithmic reflection signal of SiO$_2$, in particular in the range from 1150 cm$^{-1}$ to 1250 cm$^{-1}$ is in the range from 0.002 to 0.2 (method of determination: DRIFT spectroscopy (diffuse reflectance infrared Fourier transform spectroscopy)).

The invention further provides processes for producing aqueous ink formulations, characterized in that process products according to the invention and one or more binders are mixed with water.

The invention further provides for the use of the process products according to the invention for producing anodes for lithium ion batteries.

Owing to their production according to the invention, the silicon particles from step 2) differ structurally from the silicon particles from step 1) which are used as starting material for the thermal treatment. This is apparent, for example, from the fact that the silicon particles from step 2) in the presence of water at room temperature generally display no evolution of hydrogen or an at least far lower and/or delayed evolution of hydrogen compared to the silicon particles from step 1) and therefore allow processing in aqueous ink formulations without foaming or with little foaming and thus allow the production of at least more homogeneous anode coatings.

The temperature for the thermal treatment of the silicon particles in step 2) is preferably from 400° C. to 1080° C., more preferably from 500° C. to 1060° C., yet more preferably from 600° C. to 1040° C., even more preferably from 700° C. to 1030° C., and most preferably from 750° C. to 1020° C.

The inert gas atmosphere can, for example, contain nitrogen or noble gases such as helium, neon, argon or xenon, in particular nitrogen or argon, as inert gases. The inert gas atmosphere preferably contains ≥95% by volume, more preferably ≥99% by volume, yet more preferably ≥99.5% by volume, even more preferably ≥99.9% by volume and most preferably ≥99.99% by volume, of inert gas, based on the total volume of the inert gas.

As further constituents, the inert gas atmosphere can contain, for example, reductive gases, for example hydrogen or hydrazine, or other constituents customarily present in commercially available, industrial gases. The proportion of the reductive gases is preferably ≤5% by volume, more preferably ≤1% by volume and most preferably ≤0.1% by volume. Oxygen and/or water is preferably present in the inert gas atmosphere in an amount of ≤1% by volume, more preferably ≤0.1% by volume, even more preferably ≤0.01% by volume and most preferably ≤0.001% by volume. Greatest preference is given to the inert gas atmosphere not containing any oxygen and not containing any water. The proportion of gases or carbon precursors as are customarily used in CVD (chemical vapor deposition) processes, in particular aliphatic, unsaturated or aromatic hydrocarbons, which preferably have from 1 to 10 carbon atoms, for example methane, ethane, propane, ethylene, acetylene, benzene, toluene, styrene, ethylbenzene, is preferably ≤1% by volume, more preferably ≤0.1% by volume and even more preferably ≤0.01% by volume. The inert gas atmosphere most preferably does not contain any carbon precursors. The figures in percent by weight are based on the total volume of the inert gas.

The pressure in the thermal treatment in the inert gas atmosphere in step 2) can be, for example, from 0.5 to 2 bar, preferably from 0.8 to 1.5 bar and more preferably 1 atm. Particular preference is given to working at ambient pressure.

As an alternative, the thermal treatment in step 2) can also be carried out under reduced pressure. In this embodiment, the pressure is preferably ≤0.5 bar, more preferably ≤0.1 bar and most preferably ≤20 mbar. Here, any gas phase preferably consists of the above-described inert gas atmosphere.

The thermal treatment in step 2) is generally carried out in the absence of solvents, for example water or alcohols such as methanol or ethanol. In general, there is no liquid phase present in the thermal treatment.

Silicon particles from step 1) are preferably subjected to the thermal treatment in step 2) immediately after they have been produced by means of milling and optionally subsequent storage, in particular without prior chemical reaction.

The silicon particles are generally not coated with carbon or polymers before or during the thermal treatment in step 2).

Thus, there are generally no carbon-containing compounds such as polymers or carbon precursors, in particular not the abovementioned carbon precursors, present in step 2). Thus, no reaction of silicon particles with carbon-containing compounds generally occurs before or during the performance of step 2). The proportion of silicon particles in step 2) is preferably ≥90% by weight, more preferably ≥95% by weight and most preferably ≥99% by weight, based on the total weight of silicon particles and any carbon-containing compounds.

The thermal treatment in step 2) is preferably carried out in the presence of exclusively silicon particles and optionally an inert gas atmosphere.

In general, no milling of the silicon particles takes place in step 2).

During the thermal treatment in step 2), the inert gas atmosphere can be static over the silicon particles or can be passed through the reactor in which the thermal treatment takes place.

The duration of the thermal treatment in step 2) can vary over a wide range and is also dependent on the temperature selected for the thermal treatment. A temperature and duration of the thermal treatment which fulfils the purpose in the individual case can easily be determined by a person skilled in the art with the aid of a few orienting experiments. The duration of the thermal treatment or the average residence time of the silicon particles in the reactor is preferably from 1 minute to 16 hours, more preferably from 3 minutes to 6 hours and most preferably from 10 minutes to 2 hours.

The thermal treatment can be carried out in conventional, static or dynamic, reactors, for example in tube furnaces, rotary tube furnaces, fluidized-bed reactors or moving-bed reactors. Particular preference is given to calcination furnaces and rotary tube furnaces.

The process can be operated continuously or discontinuously.

The silicon particles used in step 2) preferably have volume-weighted particle size distributions having diameter percentiles $d_{50}$ of from 1.0 to 8.0 μm, more preferably from 2.0 to 7.0 μm and most preferably from 3.0 to 6.0 μm.

The volume-weighted particle size distribution of the silicon particles from step 1) preferably has a diameter percentiles $d_{10}$ of preferably from 0.5 μm to 10 μm, more preferably from 0.5 μm to 5.0 μm and most preferably from 0.5 μm to 3.0 μm.

The volume-weighted particle size distribution of the silicon particles from step 1) preferably has a diameter percentile $d_{90}$ of from 2.0 μm to 20.0 μm, particularly preferably from 3.0 to 15.0 μm and most preferably from 5.0 μm to 10.0 μm.

The volume-weighted particle size distribution of the silicon particles from step 1) preferably has a width $d_{90}-d_{10}$ of ≤20.0 μm, more preferably ≤15.0 μm, even more preferably ≤12.0 μm, yet more preferably ≤10.0 μm and most preferably ≤7.0 μm.

The volume-weighted particle size distribution of the silicon particles can be determined by static laser light scattering using the Mie model and the measuring instrument Horiba LA 950 using alcohols, for example ethanol or isopropanol, or preferably water, as a dispersion medium for the silicon particles.

The silicon particles from step 1) are preferably based on elemental silicon. For the purposes of the present invention, elemental silicon is high-purity, polycrystalline silicon having a small proportion of foreign atoms (for example B, P, As), silicon deliberately doped with foreign atoms (for example B, P, As), for example solar silicon, but also silicon from metallurgical processing which can have elemental contamination (for example Fe, Al, Ca, Cu, Zr, Sn, Co, Ni, Cr, Ti, C).

The silicon particles from step 1) preferably contain ≥95% by weight, more preferably ≥98% by weight, yet more preferably ≥99% by weight and most preferably ≥99.9% by weight, of silicon. The figures in percent by weight are based on the total weight of the silicon particles from step 1), in particular on the total weight of the silicon particles from step 1) minus the oxygen content thereof. The proportion according to the invention of silicon in the silicon particles from step 1) can be determined by means of ICP (inductively coupled plasma) emission spectrometry in accordance with EN ISO 11885:2009 using the measuring instrument Optima 7300 DV, Perkin Elmer.

The silicon particles from step 1) generally contain silicon oxide. Silicon oxide is preferably present on the surface of the silicon particles. An oxide layer can completely or partly cover the surface of the silicon particles. Silicon oxide, in particular in the form of oxide layers, can generally be formed during milling of silicon in an oxidative atmosphere or in an oxidative medium or be formed on contact of the silicon particles obtained by means of milling with an oxidative atmosphere, for example during storage of the silicon particles. Such oxide layers are also referred to as native oxide layers.

The silicon particles from step 1) generally bear an oxide layer, in particular a silicon oxide layer, having a thickness of preferably from 0.5 to 30 nm, more preferably from 1 to 10 nm and most preferably from 1 to 5 nm, on their surface (method of determination: for example HR-TEM (high-resolution transmission electron microscopy)).

The silicon particles from step 1) preferably contain from 0.1 to 5.0% by weight, more preferably from 0.1 to 2% by weight, yet more preferably from 0.1 to 1.5% by weight and most preferably from 0.2 to 0.8% by weight, of oxygen, based on the total weight of the silicon particles from step 1) (determined using the Leco TCH-600 analyzer).

The silicon particles from step 1) are preferably not aggregated, more preferably not agglomerated.

Aggregated means that spherical or largely spherical primary particles as are, for example, initially formed in gas-phase processes in the production of silicon particles grow together to form aggregates, for example are linked by covalent bonds. Primary particles or aggregates can form agglomerates. Agglomerates are a loose assembly of aggregates or primary particles. Agglomerates can easily be broken up again into the primary particles or aggregates, for example by means of kneading or dispersing processes. Aggregates cannot be broken up into the primary particles, or be broken up only to a small extent, by means of these methods. Aggregates and agglomerates generally have quite different sphericities and particle shapes than the preferred silicon particles and are generally not spherical. The presence of silicon particles in the form of aggregates or agglomerates can, for example, be made visible by means of conventional scanning electron microscopy (SEM). Static light scattering methods for determining the particle size distributions or particle diameters of silicon particles, on the other hand, cannot distinguish between aggregates or agglomerates.

The BET surface areas of the silicon particles from step 1) are preferably from 0.2 to 8.0 m$^2$/g, more preferably from 0.5 to 5.0 m$^2$/g and most preferably from 1.0 to 5.0 m$^2$/g (determination in accordance with DIN 66131 (using nitrogen)).

The silicon particles from step 1) have a sphericity of preferably 0.3≤ψ≤0.9, more preferably 0.5≤ψ≤0.85 and most preferably 0.65≤ψ≤0.85. Silicon particles having such sphericities are, in particular, obtainable by milling processes. The sphericity ψ is the ratio of the surface area of a sphere of the same volume to the actual surface area of a body (definition of Wadell). Sphericities can, for example, be determined from conventional SEM images.

The silicon particles from step 1) preferably have sharp-edged fracture surfaces or are preferably splitter-shaped.

The silicon particles from step 1) can be obtained by milling of silicon. The milling can, for example, be carried out by wet milling processes or in particular by dry milling processes. Preference is given to using planetary ball mills, stirred ball mills or in particular jet mills, for example opposed-jet mills or impact mills.

Milling processes generally give unaggregated silicon particles. On the other hand, the production of silicon particles by means of gas-phase processes, for example vapor deposition, is known to lead to aggregated silicon particles.

The milling of silicon can be carried out in an oxidative atmosphere. Dry milling processes in particular are carried out in an oxidative atmosphere. An oxidative atmosphere can contain, for example, carbon dioxide, nitrogen oxides, sulfur dioxide, ozone, peroxides, in particular oxygen or water vapor, as oxidative gases. The oxidative atmosphere contains oxidative gases in an amount of preferably from 1 to 100% by volume, more preferably from 5 to 80% by volume and even more preferably from 10 to 50% by volume. The oxidative atmosphere can also contain inert gases, for example nitrogen, noble gases or other inert gases. Inert gases are present in an amount of preferably ≤99% by volume, more preferably from 20 to 95% by volume and most preferably from 50 to 90% by volume.

The oxidative atmosphere can also contain impurities or other gaseous components, preferably in an amount of ≤10% by volume, more preferably ≤5% by volume and most preferably ≤1% by volume. The figures in % by volume are in each case based on the total volume of the oxidative atmosphere. The oxidative atmosphere most preferably contains air. The oxidative atmosphere preferably contains oxidative gases having a partial pressure of preferably from 0.3 to 200 bar, more preferably from 0.5 to 100 bar, yet more preferably from 0.4 to 10 bar and most preferably from 0.6 to 4 bar. The oxidative atmosphere preferably has a pressure of preferably from 0.7 to 200 bar, more preferably from 1 to 40 bar and most preferably from 1.5 to 10 bar. Corresponding processes are, for example, described in WO 2018/082794 or WO 2018/082794.

As an alternative, the milling of silicon can also be carried out in an oxidative medium. Wet milling processes in particular are carried out in an oxidative medium. Here, silicon is preferably suspended in the oxidative medium. Examples of oxidative media are inorganic liquids such as water or organic liquids such as aliphatic or aromatic hydrocarbons, esters or in particular alcohols. Examples of alcohols are methanol, butanol, in particular ethanol and propanol. Organic liquids preferably contain less than 5% by weight of water, more preferably less than 1% by weight of water. Corresponding processes are, for example, described in WO 2017/025346.

The silicon particles obtained by means of milling can also be exposed to an oxidative atmosphere in step 1), for example during storage of the silicon particles. Here, the oxidative atmosphere can have a composition as described above. Preferred oxidative gases are carbon dioxide, nitrogen oxides, ozone, in particular oxygen or water vapor. The oxidative atmosphere most preferably contains air. The oxidative atmosphere here has a pressure of preferably from 0.7 to 2 bar, more preferably 1 atm or ambient pressure. As an alternative, storage can also be carried out under an inert gas atmosphere, in particular under the above-described inert gas atmosphere. Storage of the silicon particles is preferably carried out at temperatures of preferably from 0° C. to 50° C., more preferably from 10° C. to 40° C. and most preferably from 15° C. to 30° C. The silicon particles can, for example, be stored for up to several hours, one or more days, one or more weeks or one or more years.

The silicon particles obtained in step 2) preferably have volume-weighted particle size distributions $d_{50}$, $d_{10}$, $d_{90}$ and $d_{90}$-$d_{10}$, sphericities, BET surface areas, proportions by weight of silicon and/or proportions by weight of oxygen or any other constituents and oxide layer thicknesses as indicated above for the silicon particles from step 1). This also applies to the particle shape indicated, for example unaggregated particles or particles with sharp-edged fracture surfaces or splinter-shaped particles.

The silicon particles obtained in step 2) and the silicon particles from step 1) used for the production thereof preferably differ in terms of their content of oxygen and/or silicon by ≤0.2% by weight, more preferably ≤0.1% by weight, and most preferably ≤0.05% by weight, based on the total weight of the silicon particles (determination of the silicon content: by means of ICP as indicated above; determination of the oxygen content: as described further below under this heading).

Without wishing to be tied to a theory, it can be assumed that the surface structure of the silicon particles is altered during the course of the thermal treatment according to the invention in step 2). This is apparent, for example, in the configuration of the oxide layer of the silicon particles. Thus, the number of SiOH groups of the silicon particles obtained in step 2), in particular the number of SiOH groups per unit area of the surface (SiOH group density) of the silicon particles from step 2), is preferably less than the SiOH group density of the silicon particles from step 1), as can be established with the aid of DRIFT spectra (diffuse reflectance infrared Fourier transform spectroscopy). Thus, the ratio of the maximum of the negative logarithmic reflection signal of SiOH, in particular in the range from 3300 $cm^{-1}$ to 3500 $cm^{-1}$, to the maximum of the negative logarithmic reflection signal of $SiO_2$, in particular in the range from 1150 $cm^{-1}$ to 1250 $cm^{-1}$, in the DRIFT spectrum of a silicon particle from step 2) is preferably ≤0.2, more preferably ≤0.15, even more preferably ≤0.1 and most preferably <0.08 (method of determination: see further below under the heading "Measurement and evaluation of DRIFT spectra"). The abovementioned ratio is preferably ≤0.001, more preferably ≤0.01 and most preferably ≤0.03. The stability of silicon particles in water can be improved when the values according to the invention of this parameter are adhered to.

The ink formulations are preferably based on a mixture comprising silicon particles produced according to the invention from step 2), one or more binders, optionally graphite, optionally one or more further electrically conductive components and optionally one or more additives.

Preferred binders are polyacrylic acid or its alkali metal, in particular lithium or sodium, salts, polyvinyl alcohols, cellulose or cellulose derivatives, polyvinylidene fluoride, polytetrafluoroethylene, polyolefins, polyimides, in particular polyamidimides, or thermoplastic elastomers, in particular ethylene-propylene-diene terpolymers. Particular preference is given to polyacrylic acid, polymethacrylic acid or cellulose derivatives, in particular polyacrylic acid, or lithium or sodium salts thereof.

As graphite, it is generally possible to use natural or synthetic graphite. The graphite particles preferably have a volume-weighted particle size distribution between the diameter percentiles $d_{10}$>0.2 μm and $d_{90}$<200 μm.

Preferred further electrically conductive components are conductive carbon black, carbon nanotubes or metallic particles, for example copper.

Examples of additives are pore formers, dispersants, levelling agents or dopants, for example elemental lithium.

Preferred compositions for the ink formulations of the lithium ion batteries preferably contain from 5 to 95% by weight, in particular from 60 to 85% by weight, of silicon particles produced according to the invention from step 2); from 0 to 40% by weight, in particular from 0 to 20% by weight, of further electrically conductive components; from 0 to 80% by weight, in particular from 5 to 30% by weight, of graphite; from 0 to 25% by weight, in particular from 5 to 15% by weight, of binders; and optionally from 0 to 80% by weight, in particular from 0.1 to 5% by weight, of additives; where the figures in % by weight are based on the total weight of the ink formulation and the proportions of all constituents of the ink formulation add up to 100% by weight.

The processing of the constituents of the ink formulation to give an anode ink or paste is preferably carried out in water or in an aqueous solvent. An aqueous solvent generally contains water and one or more organic solvents. Examples of organic solvents are tetrahydrofuran, N-methylpyrrolidone, N-ethylpyrrolidone, acetone, dimethyl sulfoxide, dimethylacetamide or ethanol. The proportion of the organic solvents is preferably ≤50% by volume, more preferably ≤20% by volume and most preferably ≤10% by volume, based on the total volume of the aqueous solvents. The water most preferably does not contain any organic solvent.

To produce the ink formulations, it is possible to use conventional apparatuses, for example rotor-stator machines, high-speed mixers, high-energy mills, planetary mixers, kneaders, stirred ball mills, shaking tables or ultrasonic instruments.

The ink formulations preferably have a pH of from 2 to 9, more preferably from 5 to 8 and most preferably from 6.5 to 7.5 (determined at 20° C., for example using a pH meter model WTW pH 340i with SenTix RJD electrode).

To produce an anode for lithium ion batteries, the ink formulation can, for example, be applied by doctor blade coating to a copper foil or another current collector. Other coating processes, e.g. spin coating, roller coating, dipcoating or slit nozzle coating, coating or spraying, can likewise be used.

The layer thickness, that is to say the dry layer thickness, of the anode coating is preferably from 2 μm to 500 μm, more preferably from 10 μm to 300 μm.

The anode material is generally dried to constant weight. The drying temperature is preferably in the temperature range from 20° C. to 300° C., more preferably from 50° C. to 150° C.

A lithium ion battery generally comprises a first electrode as a cathode, a second electrode as an anode, a membrane arranged between the two electrodes as a separator, two electrically conductive connections to the electrodes, a housing accommodating the parts mentioned, and also an electrolyte which contains lithium ions and with which the separator and the two electrodes are impregnated, with part of the second electrode containing the anode material of the invention.

All substances and materials used for producing the lithium ion battery according to the invention, as described above, are known. The production of the parts of the battery of the invention and the assembly thereof to give the battery of the invention can be carried out by the methods known in the field of battery production, for example as described in the patent application having the application number DE102015215415.7.

The invention further provides for the use of the anode materials according to the invention in lithium ion batteries which are configured so that the anode materials are only partially lithiated in the fully charged state of the lithium ion batteries.

Preference is thus given to the anode material, in particular the silicon particles, in the fully charged lithium ion battery being only partially lithiated. For the present purposes, fully charged refers to the state of the battery in which the anode material of the battery has its highest loading with lithium. Partial lithiation of the anode material means that the maximum lithium uptake capability of the silicon particles in the anode material is not exhausted. The maximum lithium uptake capability of the silicon particles generally corresponds to the formula $Li_{4.4}Si$ and is thus 4.4 lithium atoms per silicon atom. This corresponds to a maximum specific capacity of 4200 mAh per gram of silicon.

The ratio of the lithium atoms to the silicon atoms in the anode of a lithium ion battery (Li/Si ratio) can, for example, be set via the electric charging flow. The degree of lithiation of the anode material or of the silicon particles present in the anode material is proportional to the electric charging which has flowed through. In this variant, the capacity of the anode material for lithium is not fully exhausted during the charging of the lithium ion battery. This results in partial lithiation of the anode.

In an alternative, preferred variant, the Li/Si ratio of a lithium ion battery is set by cell balancing. Here, the lithium ion batteries are designed so that the lithium uptake capability of the anode is preferably greater than the lithium release capability of the cathode. This leads to the lithium uptake capability of the anode not being fully exhausted, i.e. the anode material being only partially lithiated, in the fully charged battery.

In the partial lithiation according to the invention, the Li/Si ratio in the anode material in the fully charged state of the lithium ion battery is preferably ≤2.2, more preferably ≤1.98 and most preferably ≤1.76. The Li/Si ratio in the anode material in the fully charged state of the lithium ion battery is preferably ≥0.22, more preferably ≥0.44 and most preferably ≥0.66.

The capacity of the silicon of the anode material of the lithium ion battery is preferably utilized to an extent of ≤50%, more preferably ≤45% and most preferably ≤40%, based on a capacity of 4200 mAh per gram of silicon.

The anode is preferably charged with ≤1500 mAh/g, more preferably ≤1400 mAh/g and most preferably ≤1300 mAh/g, based on the mass of the anode. The anode is preferably charged with at least 600 mAh/g, more preferably ≥700 mAh/g and most preferably ≥800 mAh/g, based on the mass of the anode. These figures preferably relate to the fully charged lithium ion battery.

The degree of lithiation of silicon or the exploitation of the capacity of silicon for lithium (Si capacity utilization a) can, for example, be determined as described in the patent application having the application number DE 102015215415.7 on page 11, line 4 to page 12, line 25, in particular with the aid of the formula given there for the Si capacity utilization α and the supplementary information under the headings "Bestimmung der Delithiierungs-Kapazität β" and "Bestimmung des Si-Gewichtsanteils $\omega s_i$" ("incorporated by reference").

The use of the silicon particles produced according to the invention in the preparation of aqueous ink formulations surprisingly leads to a lower and/or delayed formation of hydrogen, in particular compared to the silicon particles from step 1). This is all the more surprising since the silicon particles from step 1) and the silicon particles from step 2) can have the same or essentially the same oxygen content. Thus, the pressure increase after dispersing the silicon particles from step 2) in water at pH 7 and 60° C. commences after preferably ≥45 minutes, more preferably ≥60 minutes. When the silicon particles from step 2) are dispersed in water at pH 7 and 60° C., the pressure increase 30 minutes after commencement of the increase is preferably ≤1 bar, more preferably ≤0.8 bar and most preferably ≤0.6 bar. The measurement of the pressure increase is preferably carried out at 1 atm or 1 bar. A method for determining these parameters is described further below under the heading "Determination of gas evolution with the aid of aqueous dispersions of silicon powders".

In addition, unaggregated silicon particles can be obtained by the process of the invention. Caking together of different silicon particles can be prevented by means of the process of the invention. Other undesirable secondary reactions, for example formation of silicon suboxides or other by-products such as silicon nitride, can be prevented by means of the process conditions according to the invention.

The process of the invention can advantageously be made safe in a simple manner and the formation of mixtures presenting a risk of explosion can be avoided. Homogeneous, gas bubble-free anode coatings are obtainable.

The following examples serve to illustrate the invention further:

Determination of the Oxygen Content (O Content):

The determination of the oxygen content was carried out using a Leco TCH-600 analyzer. The analysis was carried out by melting the samples in graphite crucibles under an inert gas atmosphere. Detection was effected by infrared detection (three measurement cells).

Determination of the Particle Sizes:

The measurement of the particle distribution was carried out by static laser light scattering using the Mie model and a Horiba LA 950 in a greatly diluted suspension in water. The particle size distributions determined are volume-weighted.

Measurement and Evaluation of DRIFT Spectra:

35 mg of the respective Si powder were mixed with 500 mg of KBr and a DRIFT spectrum (diffuse reflectance infrared Fourier transform spectroscopy), a customary method in infrared spectroscopy for examining strongly absorbing or scattering solids, of this mixture was recorded using an instrument from Bruker Optics (Vertex 70 coupled with XSA unit) equipped with a praying mantis mirror system from Harrick Scientific Products. The negative decadic logarithm of the "reflectance" was measured as a function of the wave number.

The maximum of the $SiO_2$ signal and the maximum of the SiOH signal were employed for evaluating the DRIFT spectrum obtained in this way. The maximum of the negative logarithmic reflection signal is in the case of SiOH usually in the range from 3300 $cm^{-1}$ to 3500 $cm^{-1}$ and in the case of $SiO_2$ usually in the range from 1150 $cm^{-1}$ to 1250 $cm^{-1}$.

The DRIFT parameter is the ratio of the maximum of the negative logarithmic reflection signal of SiOH to the maximum of the negative logarithmic reflection signal of $SiO_2$.

Determination of Gas Evolution with the Aid of Aqueous Dispersions of Silicon Powders:

400 mg of the respective Si powder were dispersed in 20 g of an Li polyacrylic acid solution (Sokalan PA110S, pH 7.0, 4% strength by weight) and transferred into an impermeable and pressure-stable glass bottle (Pressure Reaction Vessel from Andrews Glass Co., 3 oz corresponding to 87 ml total volume) which was provided with a digital pressure sensor. The glass bottle was subsequently introduced into a heating jacket heated to 60° C. and the pressure in the gas bottle was measured. The measurement values obtained in this way were corrected by the contribution of the solvent to the pressure at 60° C.

Determination of Gas Evolution with the Aid of the Anode Inks:

The determination was carried out in a manner analogous to the "Determination of the gas evolution with the aid of aqueous dispersions of silicon powders" described above. 20 g of the respective anode ink were introduced into the pressure-stable glass vessel and introduced into a heating block made of aluminum which had previously been heated to 50° C. The measurement values obtained in this way were corrected by the contribution of the solvent to the pressure at 50° C.

Comparative Example 1 (CEx. 1)

Production of Si Particles by Milling:

Si particles were produced in a conventional way by milling coarse, crushed Si from the production of solar silicon in a fluidized-bed jet mill (Netzsch-Condux CGS16 with 90 $m^3$/h of air at 7 bar and an admission temperature of 300° C. as milling gas). The Si particles obtained in this way were packed under air immediately after milling and stored for 3 months at 20° C. After taking out the Si particles in air, the analytical data reported in Table 1 were obtained. The DRIFT spectrum of the product of comparative example 1 is depicted in FIG. 1.

Example 2 (Ex. 2)

Figure 2:
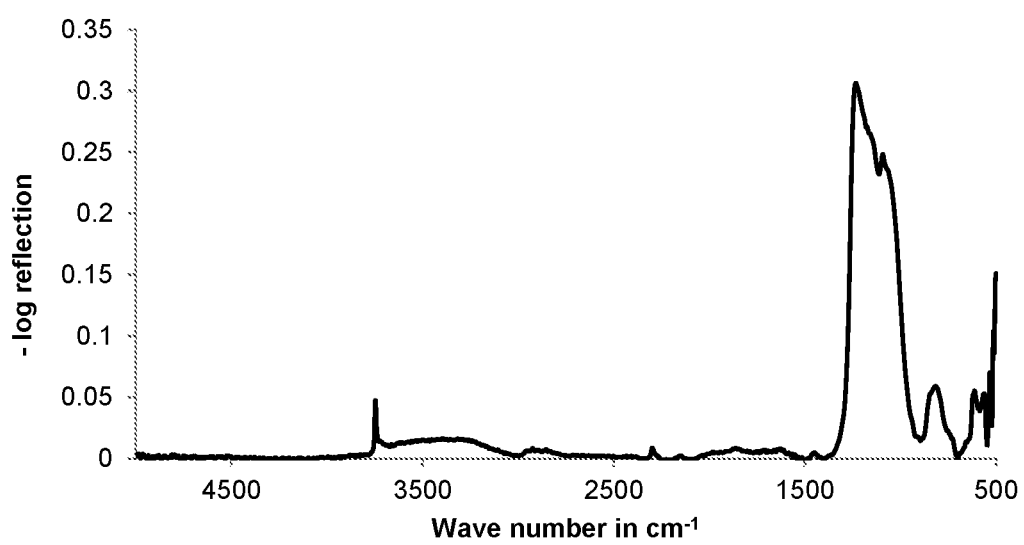
FIG. 2 is a DRIFT spectrum of one inventive silicon powder embodiment.

Thermal Treatment of Si Particles:

10 g of the Si particles produced by milling in comparative example 1 were weighed into a boat and transferred in a fused silica tube into the tube furnace MTF 12/38/400 (trade name of Carbolite). The fused silica tube was flushed with argon (grade 4.8; 3 ppm of oxygen, 5 ppm of water) for 10 minutes in order to produce an inert gas atmosphere. The furnace was subsequently heated to a particular temperature as indicated in Table 1 and maintained at this temperature for 4 hours. The tube furnace was subsequently cooled to room temperature under an inert gas atmosphere and the product was taken out. The product was examined in respect of oxygen content and particle size distribution and also by means of DRIFT spectroscopy. The DRIFT spectrum of the product of Example 2e is depicted in FIG. 2.

TABLE 1

Temperature for the thermal treatment and analytical data of the thermally treated Si particles:

| Si particles | Temperature of the thermal treatment | O content[a] [% by wt] | $D_{10}$ [μm] | $D_{50}$ [μm] | $D_{90}$ [μm] | DRIFT[b] |
|---|---|---|---|---|---|---|
| CEx. 1 | 20° C. | 0.34% | 2.5 | 4.8 | 8.2 | 0.231 |
| Ex. 2b | 300° C. | 0.35% | 2.6 | 4.9 | 8.1 | 0.176 |
| Ex. 2c | 500° C. | 0.38% | 2.5 | 4.8 | 8.3 | 0.084 |
| Ex. 2d | 750° C. | 0.38% | 2.5 | 4.8 | 8.2 | 0.065 |
| Ex. 2e | 1000° C. | 0.45% | 2.5 | 4.9 | 8.0 | 0.053 |
| CEx. 2f | 1200° C. | 0.34% | 2.6 | 4.9 | 8.1 | 0.001 |

[a]Oxygen content of the thermally treated Si particles, based on the total weight of the Si particles;
[b]The Drift parameter reflects the ratio of SiOH to $SiO_2$ in the Si particles, as described above under the heading "Measurement and evaluation of DRIFT spectra".

The thermal treatment according to the invention does not lead to any aggregation of the Si particles, as comparison of the particle diameters of comparative example 1 and example 2 shows, and also not to any significant increase in the oxygen content of the Si particles.

In the case of comparative example 2f, a reaction of $SiO_2$ and Si to form gaseous SiO occurred in the thermal treatment at 1200° C., and this gaseous SiO was carried away from the product with the inert gas stream, leading to a reduction in the oxygen content of the Si particles.

Testing of the Reactivity of the Si Particles in Aqueous Dispersions:

400 mg of Si particles from the respective (comparative) example were weighed into a Fischer-Porter vessel (pressure-stable glass vessel, Pressure Reaction Vessel from Andrews Glass Co., 3 oz corresponding to 87 ml total volume), admixed with 20 g of an aqueous Li polyacrylic acid solution (4% strength by weight) at pH 7.0, subjected to treatment with ultrasound for 1 minute, the pressure vessel was closed and subsequently heated at 60° C. in a preheated aluminum heating block.

The test results are reported in Table 2.

The commencement of gas evolution is the point in time at which the pressure in the reaction vessel begins to rise after release of the pressure which builds up without addition of the Si particles.

The pressure increase after 30 minutes is the pressure which has become established 30 minutes after commencement of hydrogen evolution.

The values reported in Table 2 are averages of duplicate determinations. The precision in multiple determinations is +/−2 to 4 minutes for commencement of gas evolution and +/−0.1 bar for the pressure increase.

TABLE 2

Gas evolution of aqueous Si particle dispersions:

| Si particles | Temperature of the thermal treatment | Commencement of gas evolution | Pressure increase after 30 min |
|---|---|---|---|
| CEx. 1 | 20° C. | 35 min | 1.0 bar |
| Ex. 2b | 300° C. | 55 min | 0.9 bar |
| Ex. 2c | 500° C. | 65 min | 0.7 bar |
| Ex. 2d | 750° C. | 78 min | 0.6 bar |
| Ex. 2e | 1000° C. | 130 min | 0.4 bar |
| CEx. 2f | 1200° C. | 67 min | 1.1 bar |

The aqueous dispersion of the Si particles of comparative example 1 which have not been thermally treated displays a rapid commencement of hydrogen formation.

The products of Examples 2b to 2e obtained by thermal treatment according to the invention have a delayed commencement of hydrogen evolution and also a reduced rate of hydrogen evolution in aqueous suspension, despite an oxygen content which is virtually identical to that in comparative example 1.

A thermal treatment above the temperature range according to the invention (comparative example 2f) even proved to be disadvantageous compared to the Si particles of comparative example 1 which have not been thermally treated, as can be seen from the higher pressure increase.

Testing of the Gas Evolution in Aqueous Ink Formulations:

29.71 g of polyacrylic acid dried to constant weight at 85° C. and 756.60 g of deionized water were agitated by means of a shaker (290 l/min) for 2.5 hours until the polyacrylic acid had completely dissolved. Lithium hydroxide monohydrate was added a little at a time to the solution until the pH was 7.0 (measured using pH meter WTW pH 340i and SenTix RJD electrode). The solution was subsequently mixed by means of the shaker for a further 4 hours.

7.00 g of the Si particles of the respective (comparative) example were dispersed in 12.50 g of the neutralized polyacrylic acid solution and 5.10 g of deionized water by means of a high-speed mixer at a speed of rotation of 4.5 m/s for 5 minutes and of 12 m/s for 30 minutes at 20° C. while cooling. After addition of 2.50 g of graphite (Imerys, KS6L C), the mixture was stirred for a further 30 minutes at a speed of rotation of 12 m/s.

The gas evolution from the anode ink obtained in this way was determined immediately after the production thereof by measuring the pressure buildup, as described above.

The pressure buildup over the anode inks was observed for 16 hours. The test results are reported in Table 3.

TABLE 3

Pressure increase of the aqueous anode ink during storage:

| Si particles | Temperature of the thermal treatment | Pressure [bar] | | | |
|---|---|---|---|---|---|
| | | Storage for 2 h | Storage for 4 h | Storage for 8 h | Storage for 16 h |
| CEx. 1 | 20° C. | 0.1 bar | 1.1 bar | 2.6 bar | 4.3 bar |
| Ex. 2b | 300° C. | 0.1 bar | 1.0 bar | 2.5 bar | 4.1 bar |
| Ex. 2c | 500° C. | 0.0 bar | 0.3 bar | 1.7 bar | 2.8 bar |
| Ex. 2e | 1000° C. | 0.0 bar | 0.1 bar | 1.2 bar | 1.8 bar |

The ink formulations according to the invention can be processed to give homogeneous electrode coatings even after a number of hours.

The anode ink containing the Si particles from comparative example 1 tends to foam after prolonged periods of time because of the strong hydrogen evolution and could not be processed to give a homogeneous electrode coating.

The invention claimed is:

1. A process for producing silicon particles which have volume-weighted particle size distributions having diameter percentiles $d_{50}$ of from 1.0 μm to 10.0 μm and an oxygen content of from 0.1 to 5% by weight, based on the total weight of the silicon particles, comprising:
   1) milling silicon to form silicon particles,
      with the milling being carried out in an oxidative atmosphere or in an oxidative medium and/or exposing silicon particles obtained by means of milling to an oxidative atmosphere, and
   2) thermally treating the silicon particles obtained in step 1) at a temperature of from 300° C. to 1100° C. in an inert gas atmosphere or under reduced pressure.

2. The process of claim 1, wherein the inert gas atmosphere comprises inert gases selected from the group consisting of nitrogen, noble gases, and mixtures thereof.

3. The process of claim 2, wherein the inert gas atmosphere contains ≥95% by volume of inert gas, based on the total volume of the inert gas atmosphere.

4. The process of claim 1, wherein the oxidative atmosphere contains one or more oxidative gases selected from the group consisting of carbon dioxide, nitrogen oxides, sulfur dioxide, ozone, peroxides, oxygen and water vapor.

5. The process of claim 1, wherein the oxidative medium contains one or more liquids selected from the group consisting of water, aliphatic or aromatic hydrocarbons, esters and alcohols.

6. The process of claim 1, wherein the silicon particles obtained in step 2) have an oxide layer having a layer thickness of from 2 to 50 nm on their surface.

7. The process of claim 1, wherein the silicon particles obtained in step 2) and the silicon particles obtained in step 1) differ in respect of their content of oxygen or silicon by ≤0.2% by weight, based on the total weight of the silicon particles.

* * * * *